United States Patent
Iio et al.

(10) Patent No.: US 9,017,905 B2
(45) Date of Patent: Apr. 28, 2015

(54) CHEMICALLY AMPLIFIED POSITIVE RESIST COMPOSITION AND PATTERN FORMING PROCESS

(71) Applicant: Shin-Etsu Chemical Co., Ltd., Tokyo (JP)

(72) Inventors: Masashi Iio, Joetsu (JP); Katsuya Takemura, Joestsu (JP); Takashi Miyazaki, Joestsu (JP); Hideyoshi Yanagisawa, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 45 days.

(21) Appl. No.: 14/033,569

(22) Filed: Sep. 23, 2013

(65) Prior Publication Data
US 2014/0087294 A1    Mar. 27, 2014

(30) Foreign Application Priority Data
Sep. 27, 2012    (JP) .................................. 2012-214395

(51) Int. Cl.
*G03F 7/039*    (2006.01)
*G03F 7/004*    (2006.01)
*G03F 7/20*    (2006.01)

(52) U.S. Cl.
CPC ............ *G03F 7/0392* (2013.01); *G03F 7/0045* (2013.01); *G03F 7/20* (2013.01)

(58) Field of Classification Search
None
See application file for complete search history.

(56) References Cited

U.S. PATENT DOCUMENTS

| 3,957,512 A | 5/1976 | Kleeberg et al. |
| 5,882,844 A * | 3/1999 | Tsuchiya et al. ........... 430/288.1 |
| 6,522,795 B1 | 2/2003 | Jordan et al. |
| 2005/0019691 A1* | 1/2005 | Tseng et al. ................. 430/270.1 |
| 2010/0119973 A1* | 5/2010 | Takita ........................ 430/281.1 |

FOREIGN PATENT DOCUMENTS

| JP | 49-115541 A | 11/1974 |
| JP | 59-108031 A | 6/1984 |
| JP | 2002-014307 A | 1/2002 |
| JP | 2004-002753 A | 1/2004 |
| JP | 2004-190008 A | 7/2004 |
| JP | 2006-106214 A | 4/2006 |

* cited by examiner

*Primary Examiner* — John A. McPherson
(74) *Attorney, Agent, or Firm* — Westerman, Hattori, Daniels & Adrian, LLP

(57) ABSTRACT

In a chemically amplified positive resist composition comprising (A) a base resin, (B) a photoacid generator, (C) a thermal crosslinker, and (D) an organic solvent, the base resin is a specific polymer and the crosslinker is a siloxane compound. A coating of the composition is readily developable in aqueous alkaline solution. On heat treatment, it forms a cured resist pattern film of satisfactory profile.

8 Claims, No Drawings

CHEMICALLY AMPLIFIED POSITIVE RESIST COMPOSITION AND PATTERN FORMING PROCESS

CROSS-REFERENCE TO RELATED APPLICATION

This non-provisional application claims priority under 35 U.S.C. §119(a) on Patent Application No. 2012-214395 filed in Japan on Sep. 27, 2012, the entire contents of which are hereby incorporated by reference.

TECHNICAL FIELD

This invention relates to a chemically amplified positive resist composition and a pattern forming process capable of forming a thick-film resist pattern with a high sensitivity and resolution.

BACKGROUND ART

While the recent trend is toward higher integration and size enlargement of microelectronic devices, there is a demand for resin-encapsulated packages of thin profile and reduced size. It is accordingly required that the surface protective layer and interlayer dielectric film in semiconductor devices and the re-distribution layer of semiconductor packages be formed of materials having better electric properties, heat resistance and mechanical properties. Polyimide resins are one class of materials that meet the required properties. For example, polyimide resins can be modified to be photosensitive. Attempts are made to use such photosensitive polyimide resins, because the pattern forming process can be simplified and the complex manufacture process can be shortened. See Patent Documents 1 and 2.

A film of polyimide resin is generally prepared by reacting tetracarboxylic dianhydride with diamine to form a polyimide precursor (or polyamic acid), applying a solution or varnish of the polyimide precursor to form a thin coating such as by spin coating, and causing thermal cyclo-dehydration or ring-closing reaction. Through this cyclo-dehydration step, the polyimide resin is cured. In the case of polyimide resins resulting from polyimide precursors, however, a problem arises that volume shrinkage attributable to dehydration or imidization can occur upon curing, leading to a loss of film thickness and a lowering of dimensional accuracy. Nowadays, it is desired to form a film at low temperature. What is needed in this sense is a polyimide resin which can be subjected to cyclo-dehydration at low temperature to form a film having physical properties comparable to those of the film obtained from cyclo-dehydration at high temperature. Nevertheless, when the polyimide precursor is cured at low temperature, the cured film becomes brittle or degraded in physical properties because of incomplete imidization.

On the other hand, studies are made on photosensitive resins based on other heat resistant polymers which do not need cyclo-dehydration unlike the polyimide precursors. See Patent Documents 3 to 6. Particularly in such applications as the re-distribution layer in semiconductor packages, a positive photosensitive resin composition which is developable in alkaline aqueous solution and yet can form a pattern having high heat resistance is needed from the aspect of environmental load reduction.

Although the positive photosensitive resin composition which is developable in alkaline aqueous solution has some acceptable properties including heat resistance, further improvements in sensitivity and resolution are needed.

CITATION LIST

Patent Document 1: JP-A S49-115541 (U.S. Pat. No. 3,957,512)
Patent Document 2: JP-A S59-108031
Patent Document 3: JP-A 2006-106214
Patent Document 4: JP-A 2004-002753
Patent Document 5: JP-A 2004-190008
Patent Document 6: JP-A 2002-014307 (U.S. Pat. No. 6,522,795)

SUMMARY OF INVENTION

An object of the invention is to provide a chemically amplified positive resist composition which exhibits a high sensitivity and resolution, and is adapted to form a thick film via alkaline aqueous solution development and subsequently a cured film having high heat resistance via post-development heat treatment. Another object is to provide a pattern forming process and a cured resist pattern film obtained therefrom.

The inventors have found that the above and other objects are attained by forming a pattern from a chemically amplified positive resist composition comprising a polymer comprising recurring units having the general formula (1) as a base resin, and a siloxane compound of structure having the general formula (2) as a thermal crosslinker.

In one aspect, the invention provides a chemically amplified positive resist composition comprising (A) a base resin, (B) a photoacid generator, (C) a thermal crosslinker, and (D) an organic solvent. The base resin (A) is a polymer comprising recurring units having the general formula (1):

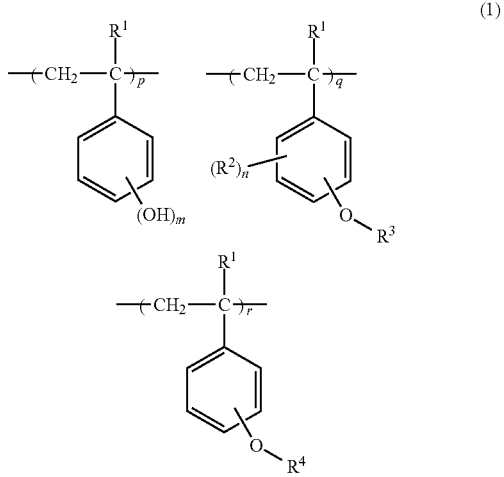

wherein $R^1$ is each independently hydrogen, hydroxyl, straight or branched alkyl, or trifluoromethyl, $R^2$ is hydroxyl or trifluoromethyl, $R^3$ is $C_4$-$C_{20}$ tertiary alkyl, $R^4$ is an acid labile group exclusive of tertiary alkyl, n is 0 or an integer of 1 to 4, m is 0 or an integer of 1 to 5, p, q and r each are 0 or a positive number, meeting $0.8 \leq p+q+r \leq 1$, the polymer having a weight average molecular weight of 1,000 to 500,000. The thermal crosslinker (C) is a siloxane compound comprising structural units having the general formula (2):

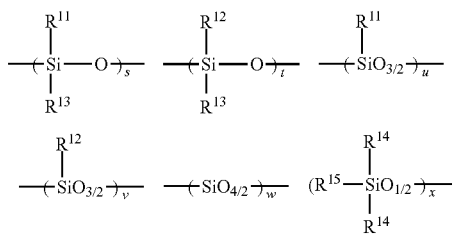

(2)

wherein $R^{11}$ is a crosslinking group having the general formula (3-1), (3-2) or (3-3):

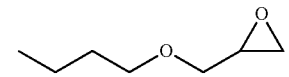

(3-1)

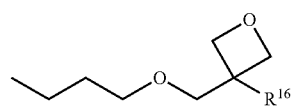

(3-2)

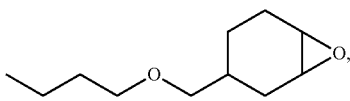

(3-3)

$R^{12}$ is a straight, branched or cyclic $C_1$-$C_{12}$ alkyl or aryl group, $R^{13}$ and $R^{14}$ each are as defined for $R^{12}$ or a $C_1$-$C_6$ alkoxy group, $R^{15}$ is as defined for $R^{11}$, $R^{12}$ or $R^{13}$, s, u and x each are 0 or a positive number, at least one of s, u and x is a positive number, with the proviso that $R^{15}$ is $R^{11}$ when both s and u are 0, t, v and w each are 0 or a positive number, s+t+u+v+w+x=1, and $R^{16}$ is hydrogen, $C_2$-$C_{20}$ alkyl, benzyl, phenyl or tolyl.

In a preferred embodiment, the thermal crosslinker (C) is a siloxane compound comprising structural units having the general formula (4):

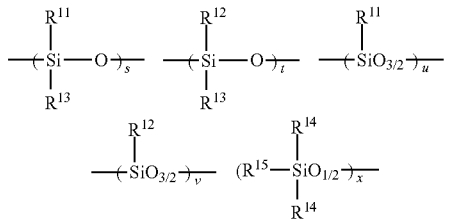

(4)

wherein $R^{11}$, $R^{12}$, $R^{13}$, $R^{14}$, $R^{15}$, s, t, u, v and x are as defined above, and s+t+u+v+x=1.

In another preferred embodiment, the thermal crosslinker (C) is a siloxane compound having a structure of the general formula (5) and containing at least two $R^{11}$ groups per molecule,

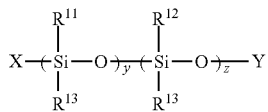

(5)

wherein X is trimethylsiloxy or a group of the following formula (6), Y is trimethylsilyl or a group of the following formula (7), X and Y may bond together to form a cyclic siloxane structure,

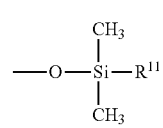

(6)

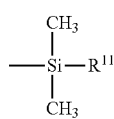

(7)

$R^{11}$, $R^{12}$, and $R^{13}$ are as defined above, y and z each are 0 or a positive number, and the sum of y and z is in a range of 2 to 10,000, with the proviso that X is a group of formula (6) and Y is a group of formula (7) when y is 0.

In a more preferred embodiment, the thermal crosslinker (C) is a siloxane compound having a structure of the general formula (8), (9) or (10):

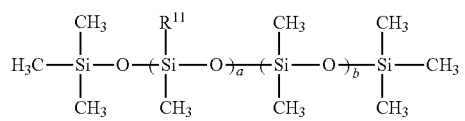

(8)

wherein $R^{11}$ is as defined above, a is a positive number of at least 2, b is 0 or a positive number, and the sum of a and b is 2 to 10,000,

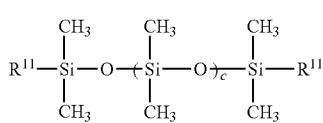

(9)

wherein $R^{11}$ is as defined above, c is 0 or a positive number from more than 0 to 10,000,

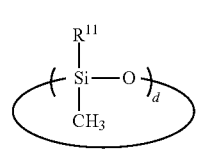

(10)

wherein $R^{11}$ is as defined above, and d is a positive number of 3 to 10.

The resist composition may further comprise (E) 0.01 to 2 parts by weight of a basic compound per 100 parts by weight of component (A).

In another aspect, the invention provides a pattern forming process comprising the steps of applying the chemically amplified positive resist composition defined above onto a substrate to form a resist layer, exposing a selected region of the resist layer, and developing.

The pattern forming process may further comprise the step of heating the resist pattern layer resulting from the development step at 100 to 250° C. to form a cured resist pattern layer.

Also contemplated herein is a cured resist pattern film obtained by the pattern forming process.

ADVANTAGEOUS EFFECTS OF INVENTION

The chemically amplified positive resist composition is readily developable in alkaline aqueous solution and has advantages including satisfactory sensitivity, resolution, development and pattern profile. A satisfactory cured resist pattern film can be formed via development and subsequent heat treatment.

DESCRIPTION OF PREFERRED EMBODIMENTS

The terms "a" and "an" herein do not denote a limitation of quantity, but rather denote the presence of at least one of the referenced item. As used herein, the notation ($C_n$-$C_m$) means a group containing from n to m carbon atoms per group.

The abbreviations and acronyms have the following meaning.
Mw: weight average molecular weight
Mn: number average molecular weight
Mw/Mn: molecular weight distribution or dispersity
GPC: gel permeation chromatography
PEB: post-exposure bake
PAG: photoacid generator One embodiment of the invention provides a chemically amplified positive resist composition comprising (A) a base resin, (B) a PAG, (C) a thermal crosslinker, and (D) an organic solvent. The base resin (A) used herein is a polymer comprising recurring units represented by the general formula (1) and having a weight average molecular weight (Mw) of 1,000 to 500,000.

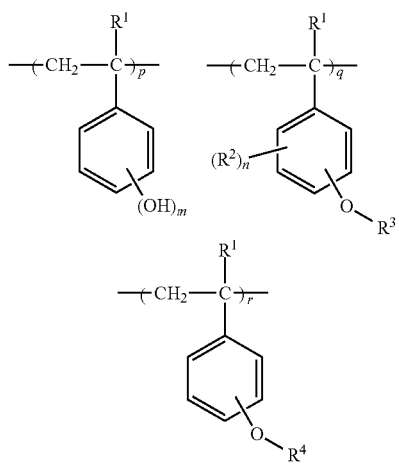

(1)

Herein $R^1$ is each independently hydrogen, hydroxyl, straight or branched alkyl, or trifluoromethyl, $R^2$ is hydroxyl or trifluoromethyl, $R^3$ is $C_4$-$C_{20}$ tertiary alkyl, $R^4$ is an acid labile group exclusive of tertiary alkyl, n is 0 or a positive integer of 1 to 4, m is 0 or a positive integer of 1 to 5, p, q and r each are 0 or a positive number, meeting $0.8 \leq p+q+r \leq 1$.

Examples of the straight or branched alkyl group of $R^1$ include methyl, ethyl, propyl, isopropyl, n-butyl, isobutyl, and tert-butyl. The tertiary alkyl group of $R^3$ may be branched or cyclic and typically has 4 to 20 carbon atoms, preferably 4 to 12 carbon atoms. Examples include tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl.

$R^4$ is an acid labile group with the proviso that tertiary alkyl is excluded. Preferred groups $OR^4$ include groups having the general formulae (11) and (12), trialkylsiloxy groups in which each alkyl moiety has 1 to 6 carbon atoms, $C_4$-$C_{20}$ oxoalkoxy, tetrahydropyranyloxy, tetrahydrofuranyloxy, and trialkylsiloxy groups.

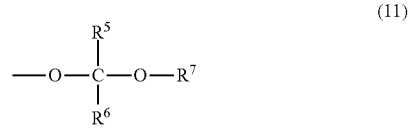

(11)

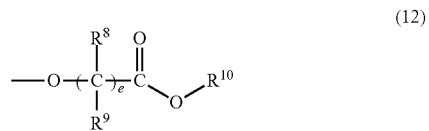

(12)

Herein $R^5$, $R^6$, $R^7$, $R^8$ and $R^9$ are each independently hydrogen or a straight or branched $C_1$-$C_8$ alkyl group. $R^{10}$ is a monovalent $C_1$-$C_{18}$ hydrocarbon group which may be separated by an oxygen atom. A pair of $R^5$ and $R^6$, $R^5$ and $R^7$, or $R^6$ and $R^7$ may bond together to form a ring, each participant of $R^5$, $R^6$ and $R^7$ is a straight or branched $C_1$-$C_{18}$ alkylene group when they form a ring. $R^{10}$ is a straight, branched or cyclic $C_4$-$C_{40}$ alkyl group, and e is 0 or an integer of 1 to 4.

Examples of the group having formula (11) include methoxyethoxy, ethoxyethoxy, n-propoxyethoxy, isopropoxyethoxy, n-butoxyethoxy, isobutoxyethoxy, tert-butoxyethoxy, cyclohexyloxyethoxy, methoxypropoxy, ethoxypropoxy, 1-methoxy-1-methylethoxy, and 1-ethoxy-1-methylethoxy. Examples of the group having formula (12) include tert-butoxycarbonyloxy, tert-butoxycarbonylmethyloxy, ethylcyclopentylcarbonyloxy, ethylcyclohexylcarbonyloxy, and methylcyclopentylcarbonyloxy. Suitable trialkylsiloxy groups are those having $C_1$-$C_6$ alkyl such as trimethylsiloxy.

In formula (1), each of p, q and r is 0 or a positive number. When properties of the resist composition are taken into account, p, q and r are preferably numbers falling in the range: $0 \leq p \leq 0.8$, more preferably $0.2 \leq p \leq 0.8$; $0 \leq q \leq 0.5$, more preferably $0 \leq q \leq 0.3$; and $0 \leq r \leq 0.5$, more preferably $0 \leq r \leq 0.3$. Outside the range, a too large value of p may lead to an extremely high alkaline dissolution rate in the unexposed region. The size and profile of a pattern can be controlled as appropriate by selecting the values of p, q and r in the above ranges. It is noted that the sum of p, q and r is in the range: $0.8 \leq p+q+r \leq 1$. That is, the polymer comprises units of at least one type selected from units (p), units (q), and units (r), and preferably consists of units (p) and units (q) and/or (r). Optionally, another unit may be incorporated in formula (1). Typically, additional units (k)

derived from (meth)acrylic acid tertiary esters, alkoxystyrenes or the like may be incorporated. In this embodiment, the proportion of p, q, r and k is preferably in the range: $0 \leq p \leq 0.8$, more preferably $0.2 \leq p \leq 0.8$; $0 \leq q \leq 0.5$, more preferably $0 \leq q \leq 0.3$; $0 \leq r \leq 0.5$, more preferably $0 \leq r \leq 0.3$; and $0 \leq k \leq 0.2$.

The polymer should preferably have a weight average molecular weight (Mw) in the range of 1,000 to 500,000, and more preferably 2,000 to 30,000, as measured by GPC versus polystyrene standards. With too low a Mw, the resist composition may become less heat resistant. A polymer with too high a Mw may lose alkaline solubility and give rise to a footing phenomenon after pattern formation.

The polymer used herein may be synthesized by any desired methods, for example, by dissolving acetoxystyrene and amyloxystyrene monomers in an organic solvent, adding a radical initiator thereto, effecting heat polymerization, and subjecting the resulting polymer to alkaline hydrolysis in the organic solvent to deprotect the acetoxy group, thereby obtaining a hydroxystyrene-amyloxystyrene copolymer. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. For the alkaline hydrolysis, aqueous ammonia, triethylamine or the like may be used as the base. The reaction temperature is −20° C. to 100° C., preferably 0° C. to 60° C., and the reaction time is 0.2 to 100 hours, preferably 0.5 to 20 hours.

It is further possible that once the resulting polymer is isolated, an acid labile group be introduced into the phenolic hydroxyl group portion thereof. For example, a haloalkyl ether compound is used and reacted with a phenolic hydroxyl group on the polymer in the presence of a base, thereby obtaining a polymer in which phenolic hydroxyl groups are, in part, protected with alkoxyalkyl groups. The solvent used in this reaction is preferably selected from aprotic polar solvents such as acetonitrile, acetone, dimethylformamide, dimethylacetamide, tetrahydrofuran and dimethyl sulfoxide, which may be used alone or in admixture. Preferred examples of the base include triethylamine, pyridine, diisopropylamine, and potassium carbonate. The amount of the haloalkyl ether compound used is preferably at least 10 mol % based on the moles of phenolic hydroxyl groups on the polymer. The reaction temperature is −50° C. to 100° C., preferably 0° C. to 60° C., and the reaction time is 0.5 to 100 hours, preferably 1 to 20 hours.

Also, an acid labile group may be introduced by reacting a dialkyl dicarbonate compound or alkoxycarbonylalkyl halide with the polymer in a solvent in the presence of a base. The solvent used in this reaction is preferably selected from aprotic polar solvents such as acetonitrile, acetone, dimethylformamide, dimethylacetamide, tetrahydrofuran and dimethyl sulfoxide, which may be used alone or in admixture. Preferred examples of the base include triethylamine, pyridine, imidazole, diisopropylamine, and potassium carbonate. The amount of the reactant used is preferably at least 10 mol % based on the moles of phenolic hydroxyl groups on the polymer. The reaction temperature is 0° C. to 100° C., preferably 0° C. to 60° C., and the reaction time is 0.2 to 100 hours, preferably 1 to 10 hours.

Exemplary of the dialkyl dicarbonate compound are di-tert-butyl dicarbonate and di-tert-amyl dicarbonate. Examples of the alkoxycarbonylalkyl halide include tert-butoxycarbonylmethyl chloride, tert-amyloxycarbonylmethyl chloride, tert-butoxycarbonylmethyl bromide and tert-butoxycarbonylethyl chloride.

It is noted that the synthesis is not limited to the aforementioned processes.

The PAG (B) is a compound capable of generating an acid upon exposure to high-energy radiation. Preferred PAGs are sulfonium salts, iodonium salts, sulfonyldiazomethane, N-sulfonyloxyimide, benzoin sulfonate, pyrogallol trisulfonate, nitrobenzene sulfonate, sulfone, and glyoxime derivative acid generators. These PAGs are illustrated below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodonium salts are salts of iodonium cations with sulfonates. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide PAGs include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate PAGs include benzoin tosylate, benzoin mesylate, and benzoin butanesulfonate.

Pyrogallol trisulfonate PAGs include pyrogallol, phloroglycinol, catechol, resorcinol, and hydroquinone, in which all hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate PAGs include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by trifluoromethyl.

Sulfone PAGs include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Glyoxime derivative PAGs include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexylsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Of these PAGs, the bissulfonyldiazomethane and N-sulfonyloxyimide compounds are preferred.

In the chemically amplified positive resist composition, an appropriate amount of the PAG (B) is 0.05 to 20 parts, preferably 1 to 10 parts by weight per 100 parts by weight of the base resin (A). Less than 0.05 pbw of the PAG may fail to provide a sufficient contrast (difference of dissolution rate in developer between exposed and unexposed regions) whereas more than 20 pbw may adversely affect resolution due to light absorption of the PAG itself.

Component (C) is a thermal crosslinker. A siloxane compound of formula (2) is used as the thermal crosslinker. This siloxane compound has at least one epoxy group, preferably at least two epoxy groups, per molecule. Depending on their preparation method, the siloxane compounds are divided into two: (C-a) a siloxane compound obtained from condensation reaction of a hydrolyzable silane compound having an epoxy or oxetane group and (C-b) a siloxane compound obtained from hydrosilylation reaction of an olefin compound having an epoxy or oxetane group.

(C-a) Siloxane Compound Obtained from Condensation Reaction of Hydrolyzable Silane Having Epoxy or Oxetane The siloxane compound obtained from condensation reaction of a hydrolyzable silane compound having an epoxy or oxetane group comprises structural units having the general formula (2).

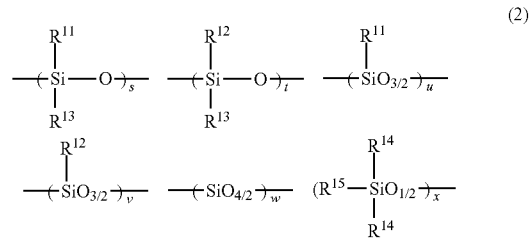

Herein $R^{11}$ is a crosslinking group having the general formula (3-1), (3-2) or (3-3).

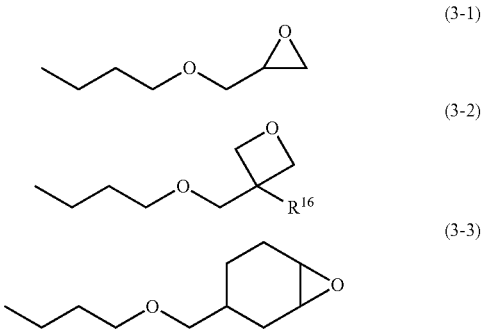

$R^{12}$ is a straight, branched or cyclic $C_1$-$C_{12}$ alkyl or aryl group, $R^{13}$ and $R^{14}$ each are as defined for $R^{12}$ or a $C_1$-$C_6$ alkoxy group, $R^{15}$ is as defined for $R^{11}$, $R^{12}$ or $R^{13}$.

In formula (2), s, u and x each are 0 or a positive number, any one of s, u and x is necessarily a positive number, with the proviso that $R^{15}$ is identical with $R^{11}$ when both s and u are 0

($s=u=0$). Also, t, v and w each are 0 or a positive number, meeting $s+t+u+v+w+x=1$. $R^{16}$ is hydrogen, $C_2$-$C_{20}$ alkyl, benzyl, phenyl or tolyl.

More preferred are siloxane compounds having the general formula (4).

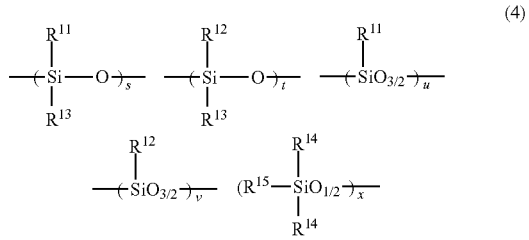

Herein $R^{11}$, $R^{12}$, $R^{13}$, $R^{14}$, $R^{15}$, s, t, u, v and x are as defined above, and $s+t+u+v+x=1$.

It is noted that in formulae (2) and (4), the sum of s, u and x is preferably in the range: $0.2 \leq s+u+x \leq 1$, when $R^{15}$ is identical with $R^{11}$.

In view of the degree of polymerization of organopolysiloxane, the siloxane compounds of formulae (2) and (4) may range from a dimer having two silicon atoms to a polymer having about 10,000 silicon atoms. Oligomers and polymers having 2 to about 50 silicon atoms are preferred. Inter alia, oligomers having 2 to 10 silicon atoms are more preferred while they may be used alone or in admixture. An organopolysiloxane having too high a degree of polymerization may be less compatible with the base resin (A).

In formulae (2) and (4), $R^{12}$ is a straight, branched or cyclic $C_1$-$C_{12}$ alkyl group, examples of which include methyl, ethyl, propyl, isopropyl, butyl, isobutyl, s-butyl, t-butyl, pentyl, cyclopentyl, hexyl, cyclohexyl, octyl and decyl, or an aryl group, examples of which include phenyl and naphthyl. Each of $R^{13}$ and $R^{14}$ is a group like $R^{12}$ or a $C_1$-$C_6$ alkoxy group, such as methoxy, ethoxy, or butoxy. $R^{15}$ is a group like $R^{11}$, $R^{12}$ or $R^{13}$. It is most preferred that $R^{12}$ be methyl because the organopolysiloxane is easy to synthesize and does not adversely affect the pattern profile of the resist composition.

Synthesis of the siloxane compound (C-a) by condensation reaction of a hydrolyzable silane compound having an epoxy or oxetane group may be conducted by any well-known method. Specifically, a hydrolyzable silane compound having an epoxy or oxetane group or a compound obtained from partial hydrolysis and condensation thereof is hydrolyzed and condensed in the presence of an acid catalyst, yielding a polyorganosiloxane compound having formula (2). If desired, modification may be made by co-hydrolysis/condensation with a silane compound having a hydrolyzable group, but not a crosslinking group such as epoxy or oxetane.

Suitable silane compounds having an epoxy-containing organic group and a hydrolyzable group include epoxy-containing alkoxysilanes, such as 3-glycidoxypropyl(methyl) dimethoxysilane, 3-glycidoxypropyl(methyl)diethoxysilane, 3-glycidoxypropyl(methyl)dibutoxysilane, 2-(3,4-epoxycyclohexyl)ethyl(methyl)dimethoxysilane, 2-(3,4-epoxycyclohexyl)ethyl(phenyl)diethoxysilane, 3-glycidoxypropyltrimethoxysilane, 3-glycidoxypropyltriethoxysilane, 3-glycidoxypropyltributoxysilane, 2-(3,4-epoxycyclohexyl) ethyltrimethoxysilane, and 2-(3,4-epoxycyclohexyl)ethyltriethoxysilane. Suitable oxetane-containing alkoxysilane compounds include ethyl-3-oxetanoxypropyl(methyl) dimethoxysilane, ethyl-3-oxetanoxypropyl(methyl) diethoxysilane, and ethyl-3-oxetanoxypropyl(methyl) dibutoxysilane. Inter alia, 3-glycidoxypropyltrimethoxysilane, ethyl-3-oxetanoxypropyltrimethoxysilane, and 2-(3,4-epoxycyclohexyl)ethyltriethoxysilane are preferred.

The synthesis of the siloxane compound (C-a) by condensation reaction may also be conducted by starting with a silane having an epoxy or oxetane-containing organic group and a hydrolyzable group, typically glycidoxypropyltrimethoxysilane alone. Depending on the desired structure or the like, a silane having a hydrolyzable group, but not an epoxy-containing organic group, for example, phenyltrimethoxysilane or dimethyldimethoxysilane may be co-condensed.

The condensation reaction may be conducted by the standard procedure, preferably in the presence of an acid catalyst such as acetic acid, hydrochloric acid, sulfuric acid or methanesulfonic acid. Typically, condensation reaction is conducted in an organic solvent. Suitable organic solvents include alcohols, ketones, esters, cellosolves, and aromatic compounds, with the alcohols such as methanol, ethanol, isopropyl alcohol, isobutyl alcohol, n-butanol and 2-butanol being preferred.

(C-b) Siloxane Compound Obtained from Hydrosilylation Reaction of Olefin Having Epoxy or Oxetane The siloxane compound obtained from hydrosilylation reaction of an olefin compound having an epoxy or oxetane group preferably has the general formula (5).

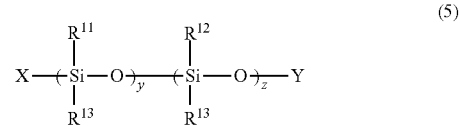

Herein X is trimethylsiloxy or a group of the following formula (6), Y is trimethylsilyl or a group of the following formula (7), X and Y may bond together to form a cyclic siloxane structure.

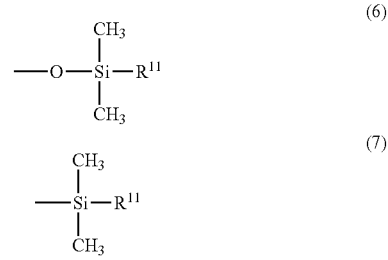

$R^{11}$, $R^{12}$, and $R^{13}$ are as defined above, y and z each are 0 or a positive number, and the sum of y and z is in a range of 2 to 10,000, preferably 2 to 50, and more preferably 2 to 10, with the proviso that X is a group of formula (6) and Y is a group of formula (7) when y is 0.

In formula (5), $R^{12}$ is as illustrated above. It is most preferred that $R^{12}$ be methyl because the organopolysiloxane is easy to synthesize and does not adversely affect the lithography pattern of the resist composition, that is, prevents the pattern from becoming T-topped.

In formula (5), y and z each are 0 or a positive number. Preferably y and z each are a positive number of up to 10, more preferably up to 8 because otherwise the siloxane compound may become less compatible with the base resin when it is formulated as crosslinker into a resist composition. In particular, y is desirably a positive number of at least 1.

The siloxane compound should preferably contain at least two $R^{11}$ groups per molecule. Then, when X is trimethylsiloxy and Y is trimethylsilyl, it is preferred that y be a positive number of at least 2. Also, when X is trimethylsiloxy and Y is a group of formula (7), or when X is a group of formula (6) and Y is trimethylsilyl, it is preferred that y be a positive number of at least 1.

Of the siloxane compounds having formula (5), those siloxane compounds having a structure of the general formulae (8), (9) and (10) are preferred.

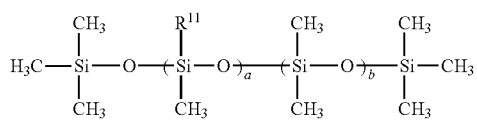
(8)

Herein $R^{11}$ is as defined above, a is a positive number of at least 2, b is 0 or a positive number, and the sum of a and b is 2 to 10,000, preferably 2 to 50, and more preferably 2 to 10.

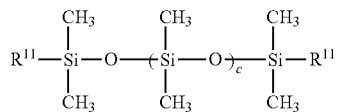
(9)

Herein $R^{11}$ is as defined above, c is 0 or a positive number from more than 0 to 10,000, preferably a positive number of 2 to 50, and more preferably 2 to 10.

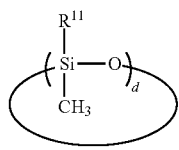
(10)

Herein $R^{11}$ is as defined above, and d is a positive number of 3 to 10.

Described below is the preparation of siloxane compounds of structure having formula (5). The siloxane compound having formula (5) may be synthesized by hydrosilylation reaction of an olefin compound having an epoxy or oxetane group. That is, synthesis may be completed by hydrosilylation or addition reaction of an olefin compound having an epoxy or oxetane group with an organohydrogenpolysiloxane corresponding to the desired structure in the presence of a platinum catalyst.

Preferred olefin compounds having an epoxy or oxetane group include the following structures.

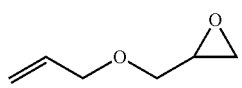
(13)

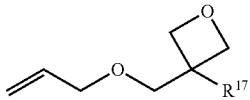
(14)

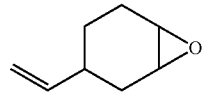
(15)

Herein, $R^{17}$ is hydrogen, $C_2$-$C_{20}$ alkyl, benzyl, phenyl or tolyl.

The organohydrogenpolysiloxane corresponding to the desired structure may be represented by the general formula (16).

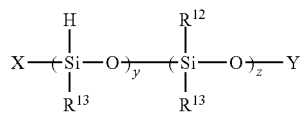
(16)

Herein X is trimethylsiloxy or a group of the following formula (17), Y is trimethylsilyl or a group of the following formula (18), X and Y may bond together to form a cyclic siloxane structure.

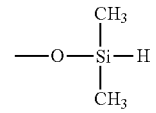
(17)

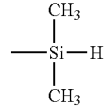
(18)

$R^{12}$ and $R^{13}$ are as defined above, y and z each are 0 or a positive number, with the proviso that X is a group of formula (17) and Y is a group of formula (18) when y is 0.

It is most preferred from the above-discussed and other aspects that $R^{12}$ be methyl.

Preferred examples of the organohydrogenpolysiloxane corresponding to the desired structure include those of the general formulae (19) to (22) shown below.

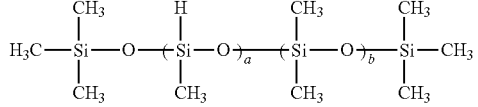
(19)

Herein a is a positive number, b is 0 or a positive number, and a+b=2 to 10,000.

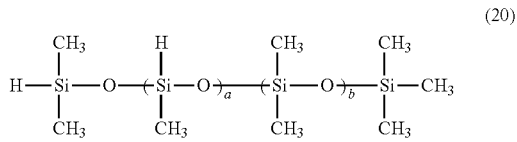

(20)

Herein a and b each are 0 or a positive number, and a+b=2 to 10,000.

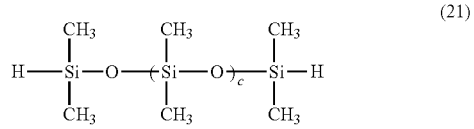

(21)

Herein c is 0 or a positive number from more than 0 to 10,000.

(22)

Herein d is a positive number of 3 to 10.

Hydrosilylation or addition reaction is conducted between an olefin compound having an epoxy or oxetane group and an organohydrogenpolysiloxane corresponding to the desired structure in the presence of a platinum or similar catalyst, at 40 to 150° C. for 1 to 20 hours, yielding a compound of the desired structure having formula (5). Suitable platinum group metal catalysts used in hydrosilylation or addition reaction include platinum, palladium, and rhodium based catalysts, for example. From the economical and other aspects, platinum-based catalysts are preferred. Suitable platinum-based catalysts include platinum, platinum black, chloroplatinic acid, for example, $H_2PtCl_6 \cdot \alpha H_2O$, $K_2PtCl_6$, $KHPtCl_6 \cdot \alpha H_2O$, $K_2PtCl_4$, $K_2PtCl_4 \cdot \alpha H_2O$, $PtO_2 \cdot \alpha H_2O$, $40PtCl_{440} \cdot \alpha H_{240}O$, $PtCl_{240}$, and $H_{240}PtCl_{440} \cdot \alpha H_2O$, wherein $\alpha$ is a positive integer, as well as complexes of the foregoing with hydrocarbons (e.g., olefins), alcohols or vinyl-containing organopolysiloxanes. These catalysts may be used alone or in admixture. The catalyst may be added in a catalytic amount. The amount is typically 0.1 to 500 ppm, preferably 0.5 to 100 ppm of platinum group metal based on the total weight of the silicone resin and the organic compound having an epoxy group and an unsaturated double bond.

The type of solvent used in the hydrosilylation reaction may be selected as appropriate depending on reaction conditions and the like. Suitable solvents include benzene, toluene, xylene, hexane, pentane, octane, decane, tetrahydrofuran, dioxane, ethyl acetate, and N,N-dimethylformamide. Any desired polymerization inhibitor may also be used, for example, hydroquinone, methoxyhydroquinone, and di-t-butylmethylphenol.

The thermal crosslinker may be used alone or in admixture of two or more, or in admixture with a thermal crosslinker (F) other than silicone compounds. An appropriate amount of the thermal crosslinker used is 0.1 to 50 parts, more preferably 2 to 30 parts by weight per 100 parts by weight of the base resin (A). Less than 0.1 pbw of the thermal crosslinker may fail to achieve a sufficient crosslink density whereas more than 50 pbw may adversely affect transparency or shelf stability due to light absorption of the crosslinker itself.

The other thermal crosslinker (F) (other than silicone compounds) causes the resist composition to cure via crosslinkage by condensation or addition reaction between the crosslinker and phenolic hydroxyl groups in the resist composition or between crosslinker molecules. Particularly when the adhesion, heat resistance, electric insulation and mechanical properties of the cured film are taken into account, a resin having at least two epoxy or oxetane groups per molecule is appropriate. Suitable epoxy compounds include phenol novolak epoxy resins, cresol novolak epoxy resins, bisphenol A epoxy resins such as diglycidyl bisphenol A, bisphenol F epoxy resins such as diglycidyl bisphenol F, triphenylmethane epoxy resins such as triphenylolpropane triglycidyl ether, alicyclic epoxy resins such as 3,4-epoxycyclohexylmethyl-3,4-epoxycyclohexane carboxylate, glycidyl ester resins such as diglycidyl phthalate, diglycidyl hexahydrophthalate, and dimethylglycidyl phthalate, and glycidyl amine resins such as tetraglycidyldiaminodiphenylmethane, triglycidyl-p-aminophenol, diglycidylaniline, diglycidyltoluidine, and tetraglycidyl bisaminomethyl cyclohexane. Suitable oxetane resins include those of phenol novolak, cresol novolak and diglycidyl bisphenol types like the foregoing epoxy resins. An appropriate amount of the other thermal crosslinker (F), if used, is preferably 1 to 15 parts by weight per 100 parts by weight of the base resin (A).

Prior to use of the resist composition, the foregoing components are dissolved in (D) an organic solvent. The organic solvent used herein is not particularly limited as long as the components are soluble therein and the resulting solution is effectively applicable. Suitable organic solvents include cellosolve solvents such as methyl cellosolve, ethyl cellosolve, methyl cellosolve acetate, and ethyl cellosolve acetate; propylene glycol solvents such as propylene glycol monomethyl ether, propylene glycol monobutyl ether, propylene glycol monomethyl ether acetate (PGMEA), propylene glycol dimethyl ether, and propylene glycol monoethyl ether acetate; ester solvents such as butyl acetate, amyl acetate, methyl lactate, ethyl lactate, 3-methoxypropionic acid, and ethyl 3-ethoxypropionate; alcohol solvents such as hexanol and diacetone alcohol; ketone solvents such as cyclohexanone and methyl amyl ketone; ether solvents such as methyl phenyl ether and diethylene glycol dimethyl ether; and highly polar solvents such as N,N-dimethylformamide and N-methylpyrrolidone, and mixtures of any two or more of the foregoing.

The solvent (D) is used in an amount of 50 to 5,000 parts, preferably 100 to 2,000 parts by weight per 100 parts by weight of the base resin (A). A composition containing less than 50 pbw of the solvent is difficult to coat onto a wafer whereas a composition containing more than 5,000 pbw of the solvent may fail to provide a sufficient coating thickness.

Optionally the resist composition may comprise (E) a basic compound. The basic compound (E) is preferably a compound capable of suppressing the rate of diffusion when the acid generated by the PAG diffuses within the resist film. The inclusion of the basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

The basic compounds may be used alone or in admixture of two or more. The basic compound is typically formulated in an amount of 0 to 2 parts, and when used, in an amount of 0.01 to 20 parts, more preferably 0.01 to 1 part by weight, per 100 parts by weight of the base resin (A). More than 2 pbw of the basic compound may result in too low a sensitivity.

If desired, any additives such as leveling agents, dyes, pigments and surfactants may be added to the resist composition. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (DIC Corp.), Fluorad FC430 and FC431 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). These surfactants may be used alone or in admixture.

In the resist composition, the surfactant is preferably formulated in an amount of up to 2 parts, more preferably up to 1 part, and even more preferably 0.01 to 0.05 part by weight, per 100 parts by weight of the base resin (A).

Below described is the pattern forming process using the chemically amplified positive resist composition defined herein. The resist composition is applied onto a substrate by any of conventional techniques such as dipping, spin coating and roll coating, and optionally prebaked on a heater means such as hot plate or oven to form a resist layer. The substrate used herein may be typically a silicon wafer or a plastic or ceramic circuit substrate. The resist layer preferably has a thickness of 0.1 to 50 μm, more preferably 1 to 30 μm. Typically the resist layer is formed as a thick film in the range of 1 to 10 μm.

Next, using an exposure tool such as a stepper or mask aligner, a selected region of the resist layer is exposed to radiation having a wide range of wavelength, for example, UV radiation such as g or i-line, through a photomask. In the practice of the invention, the desired pattern is obtainable from the resist composition even if the PEB step is omitted. However, the PEB step is effective for improving resolution and for forming a pattern in a consistent manner without a change in pattern size on every exposure.

After exposure, the resist film is developed in a developer. The developer used herein may be any of well-known alkaline developer solutions, typically an aqueous solution of tetramethylammonium hydroxide (TMAH). Development may be performed by standard techniques, for example, by immersing the film in the developer. This is optionally followed by cleaning, rinsing and drying, obtaining the desired pattern.

The chemically amplified positive resist composition is insoluble or substantially insoluble in an alkaline developer because some phenolic hydroxyl groups are protected with acid labile groups. Once the resist film is exposed, acid labile groups in the exposed region are deprotected from the phenolic hydroxyl groups under the action of an acid generated by the PAG upon exposure, whereby the exposed region is dissolved in the alkaline developer, leaving the desired positive pattern.

The resulting pattern is then heated in an oven or hot plate at 100 to 250° C. for about 10 minutes to 10 hours. This heat treatment of the film serves to promote crosslinking reaction of the crosslinker with the base resin and remove any residual volatile components, resulting in a cured film having heat resistance, transparency, low dielectric characteristics, and solvent resistance.

The cured film resulting from the chemically amplified positive resist composition has advantages including good adhesion to the substrate, heat resistance, electrical insulating properties, and mechanical properties, and thus finds application as protective film on electric and electronic components and semiconductor devices.

EXAMPLE

Examples of the invention are given below by way of illustration and not by way of limitation.

It is noted that siloxane compounds obtained in Synthesis Examples are analyzed by the following tests. The average degree of polymerization of an organopolysiloxane is obtained by carrying out GPC analysis, determining a weight average molecular weight on the basis of the calibration curve drawn from polystyrene standard samples and computing therefrom. The alkoxy content of an organopolysiloxane is determined by alkali cracking-gas chromatography (GC) (see Silicone Handbook, p 792-793, Nikkan Kogyo Shinbun). A coefficient in the average compositional formula is determined. Structure analysis on an organopolysiloxane is by silicon and proton nuclear magnetic resonance spectroscopy ($^{29}$Si- and $^1$H-NMR). From the measurement results, a coefficient in the average compositional formula is determined.

Synthesis Example 1

Synthesis of Siloxane Compound #1 of Formula (23)

A flask of 1 L volume equipped with a stirrer, cooling condenser, thermometer, and dropping funnel was charged with 305.4 g of 3-glycidoxypropyltrimethoxysilane, 204.0 g of methyltrimethoxysilane, and 48.0 g of methanol. While the contents were stirred at an internal temperature of 20-30° C., a mixture of 45.0 g of 0.05N hydrochloric acid and 10.5 g of methanol was added dropwise over 30 minutes. The reaction solution was ripened at room temperature for 3 hours.

Then, 10.6 g of 1 wt % sodium acetate in methanol was added to the reaction solution, which was ripened for 2 hours under reflux for polycondensation reaction. Thereafter, the alcohol and low-boiling fractions were distilled off by heating at an internal temperature of 55-60° C. under atmospheric pressure. Filtration gave a colorless clear liquid, which was Siloxane compound #1 of the following formula (23) (yield 90%). The number of silicon atoms in Siloxane compound #1 was determined from the moles of aqueous hydrochloric acid (water), on the assumption that 1 mole of water corresponds to a dimer of Si. Since 45 g of aqueous hydrochloric acid was used (45/18=2.5 moles of water), the number of silicon atoms was 2.5×2=5.

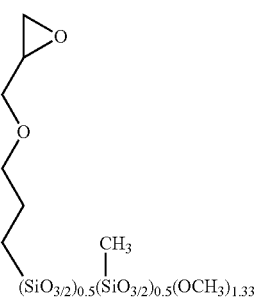

(23)

Synthesis Example 2

Synthesis of Siloxane Compound #2 of Formula (24)

Polycondensation reaction was carried out as in Synthesis Example 1 aside from using tetraethoxysilane, 3-glycidoxypropyltrimethoxysilane, and methyltrimethoxysilane. Siloxane compound #2 of the following formula (24) was obtained as a colorless clear liquid (yield 95%). The number of silicon atoms was similarly determined, finding that Siloxane compound #2 was a pentamer.

(24)

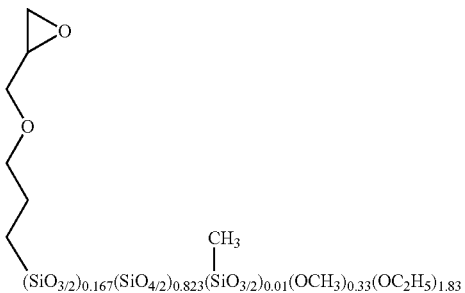

$(SiO_{3/2})_{0.167}(SiO_{4/2})_{0.823}(SiO_{3/2})_{0.01}(OCH_3)_{0.33}(OC_2H_5)_{1.83}$

Synthesis Example 3

Synthesis of Siloxane Compound #3 of Formula (26)

A separable flask of 1 L volume equipped with a stirrer, cooling condenser, thermometer, and dropping funnel was charged with 138.0 g of methylhydrogenpolysiloxane having the structural formula (25) below and 69.0 g of toluene. Then a 0.5 wt % ethanol solution of chloroplatinic acid was added so as to give a platinum concentration of 50 ppm. Once the flask was heated at 80° C., 70.2 g of allyl glycidyl ether was slowly added dropwise to the solution in the flask at 80-90° C. Stirring was continued for one hour at the temperature. At the end of reaction, the solution in the flask was concentrated at 100° C. and a vacuum of 5 mmHg, obtaining a pale yellow clear liquid, Siloxane compound #3 of the following formula (26) (yield 95%).

(25)

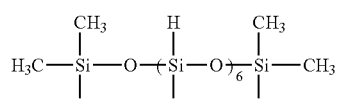

(26)

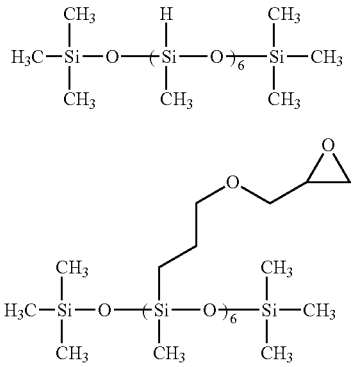

Synthesis Example 4

Synthesis of Siloxane Compound #4 of Formula (28)

A separable flask of 1 L volume equipped with a stirrer, cooling condenser, thermometer, and dropping funnel was charged with 53.1 g and 6.0 g of methylhydrogenpolysiloxanes having the structural formulae (25) and (27) below, respectively, and 28.2 g of toluene. Then a 0.5 wt % ethanol solution of chloroplatinic acid was added so as to give a platinum concentration of 50 ppm. Once the flask was heated at 50° C., 28.2 g of α-methylstyrene was slowly added dropwise to the solution in the flask at 50° C. The solution was then heated at 80° C. and ripened thereat, which is designated Solution #1. Another separable flask of 1 L volume equipped with a stirrer, cooling condenser, thermometer, and dropping funnel was charged with 98.4 g of allyl glycidyl ether and 49.2 g of toluene. Then a 0.5 wt % ethanol solution of chloroplatinic acid was added so as to give a platinum concentration of 50 ppm. Once the flask was heated at 70° C., Solution #1 was slowly added dropwise to the solution in the other flask at 70-90° C. Stirring was continued for one hour at 90° C. At the end of reaction, the solution in the flask was concentrated at 100° C. and a vacuum of 5 mmHg, obtaining a brown clear liquid, Siloxane compound mix #4 of the following formula (28) (yield 90%).

(25)

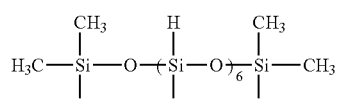

(27)

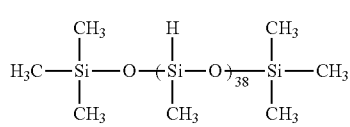

(28)

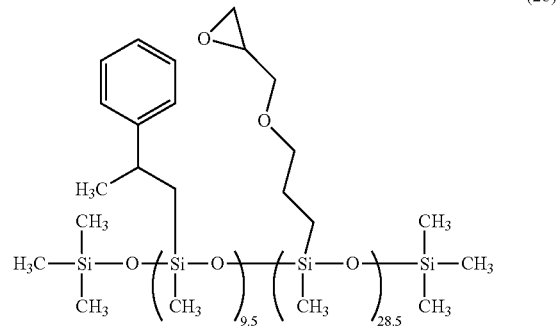

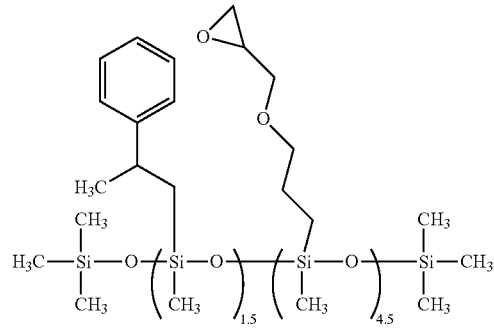

Synthesis Example 5

Synthesis of Siloxane Compound #5 of Formula (29)

A separable flask of 1 L volume equipped with a stirrer, cooling condenser, thermometer, and dropping funnel was charged with 40.7 g of allyl glycidyl ether and 180 g of toluene. Then a 0.5 wt % ethanol solution of chloroplatinic acid was added so as to give a platinum concentration of 50 ppm. 21.7 g of tetramethyldisiloxane was slowly added dropwise to the solution in the flask so that the temperature might be 30 to 70° C. At the end of reaction, 45.0 g of isopropyl alcohol was added so that the temperature might reach 70 to 80° C., and stirring was continued for 3 hours. The solution in the flask was concentrated at 100° C. and a vacuum of 10 mmHg, obtaining a pale brown clear liquid, Siloxane compound #5 of the following formula (29) (yield 88%).

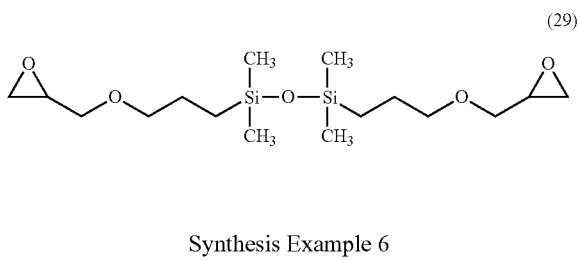

(29)

Synthesis Example 6

Synthesis of Siloxane Compound #6 of Formula (31)

Addition reaction was carried out as in Synthesis Example 5 aside from using methylhydrogenpolysiloxane of the structural formula (30) below and allyl glycidyl ether. Siloxane compound #6 of the following formula (31) was obtained as a colorless clear liquid (yield 90%).

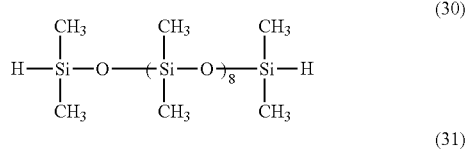

(30)

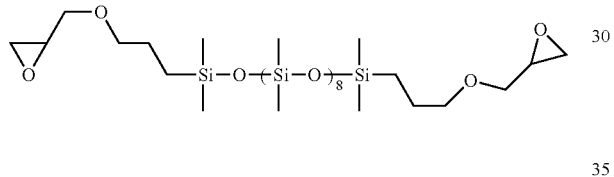

(31)

Synthesis Example 7

Synthesis of Siloxane Compound #7 of Formula (32)

Addition reaction was carried out as in Synthesis Example 5 aside from using methylhydrogenpolysiloxane of the structural formula (30) above and 1-vinyl-3,4-epoxycyclohexane. Siloxane compound #7 of the following formula (32) was obtained as a colorless clear liquid (yield 90%).

(32)

Synthesis Example 8

Synthesis of Siloxane Compound #8 of Formula (33)

Addition reaction was carried out as in Synthesis Example 5 aside from using methylhydrogenpolysiloxane of the structural formula (30) above and 3-ethyl-3-allyloxymethyloxetane. Siloxane compound #8 of the following formula (33) was obtained as a colorless clear liquid (yield 90%).

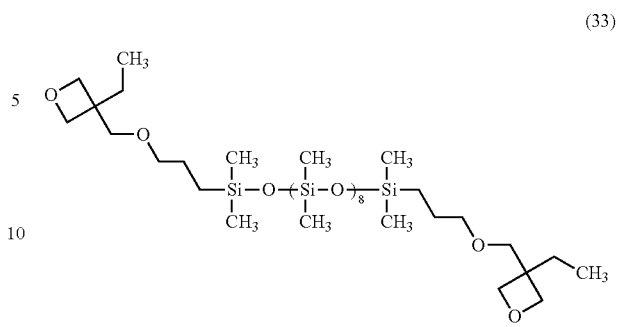

(33)

Synthesis Example 9

Synthesis of Siloxane Compound #9 of Formula (35)

Addition reaction was carried out as in Synthesis Example 5 aside from using methylhydrogenpolysiloxane of the structural formula (34) below and 1-vinyl-3,4-epoxycyclohexane. Siloxane compound #9 of the following formula (35) was obtained as a colorless clear liquid (yield 90%).

(34)

(35)

Examples 1 to 13

A resist solution was prepared by dissolving amounts (shown in Table 1) of a base resin comprising recurring units shown below (Polymer-1), a photoacid generator (PAG-1 or 2), a thermal crosslinker (Siloxane compounds #1 to #9 obtained in Synthesis Examples), a basic compound (Amine-1), shown below, and a surfactant X-70-093 (Shin-Etsu Chemical Co., Ltd.) in propylene glycol monomethyl ether acetate (PGMEA), and filtering through a membrane filter with a pore size of 1.0 μm. The resist solution was spin coated onto a 8-inch silicon wafer and soft baked (SB) on a hot plate under the conditions shown in Table 2, forming a resist film of 10 μm thick.

Comparative Examples 1 and 2

A comparative resist solution was prepared as in Example 1 except that a thermal crosslinker (Linker-1, 2) was used. The resist solution was similarly spin coated onto a 8-inch silicon wafer and soft baked on a hot plate under the conditions shown in Table 2, forming a resist film of 10 μm thick.

Patterning of Resist Composition

Using an i-line stepper (Nikon Corp., NSR-2250i11, NA=0.46), the resist film of 10.0 μm thick was exposed to i-line through a reticle, baked (PEB) on a hot plate under the conditions shown in Table 2, and developed in a 2.38 wt % TMAH aqueous solution. Specifically, development was carried out by dispensing the developer for 10 seconds while rotating the substrate, and holding stationary the substrate covered with the developer for 40 seconds. Provided that one cycle consists of developer dispensing and stationary holding, the development was repeated 4 cycles in total. This was followed by deionized water rinsing and drying, yielding the desired 1:1 hole patterns having a hole size of 5 μm, 10 μm, 20 μm and 30 μm. Each pattern was observed under a scanning electron microscope (SEM). Sensitivity is the exposure dose at which a 1:1 5-μm hole pattern was resolved at 5 μm. It is the observation point for evaluation of cure.

Evaluation of Cure

The pattern-bearing wafer was heated (hard baked) in an oven (IPHH-201 by ESPEC Corp.) at 200° C. for one hour. The pattern profile of the cured film was observed under SEM. The pattern profile was compared before and after cure, for thereby evaluating the curability of the resist composition. In Table 2, those samples whose pattern profile remained unchanged before and after cure were rated good (○), and those samples whose pattern profile changed before and after cure were rated poor (x). In particular, those samples whose pattern profile remained perpendicular were rated excellent (◎).

Polymer-1

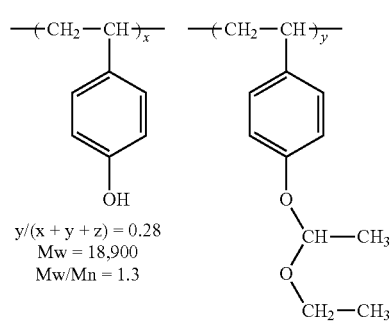

Polymer-2

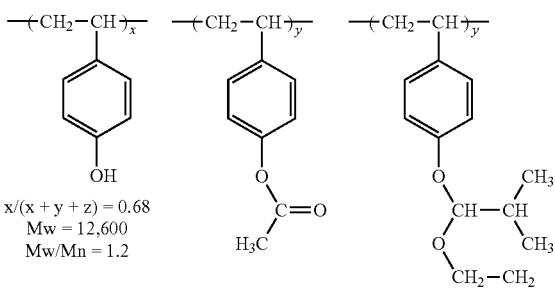

Linker-1

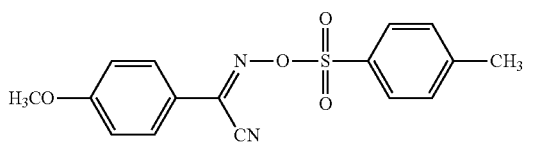

Linker-2

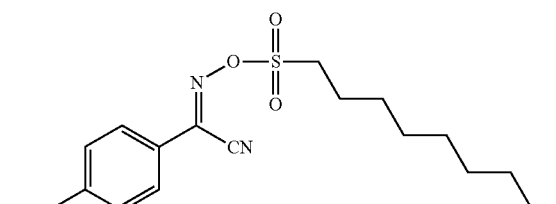

PAG-1, PAG-2

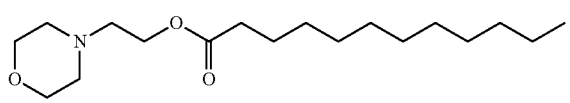

Amine-1

TABLE 1

|  |  | Base resin (pbw) | PAG (pbw) | Thermal crosslinker (pbw) | Basic compound (pbw) | Surfactant (pbw) | Solvent (pbw) |
|---|---|---|---|---|---|---|---|
| Example | 1 | Polymer-1 (100) | PAG-1 (0.55) | Siloxane compound #1 (15) | Amine-1 (0.1) | X-70-093 (0.1) | PGMEA (260) |
|  | 2 | Polymer-1 (100) | PAG-1 (0.55) | Siloxane compound #2 (15) | Amine-1 (0.1) | X-70-093 (0.1) | PGMEA (260) |
|  | 3 | Polymer-1 (100) | PAG-1 (0.55) | Siloxane compound #3 (15) | Amine-1 (0.1) | X-70-093 (0.1) | PGMEA (260) |
|  | 4 | Polymer-1 (100) | PAG-1 (0.55) | Siloxane compound #3 (5) | Amine-1 (0.1) | X-70-093 (0.1) | PGMEA (260) |
|  | 5 | Polymer-1 (100) | PAG-1 (0.55) | Siloxane compound #3 (20) | Amine-1 (0.1) | X-70-093 (0.1) | PGMEA (260) |
|  | 6 | Polymer-1 (100) | PAG-1 (0.55) | Siloxane compound #4 (15) | Amine-1 (0.1) | X-70-093 (0.1) | PGMEA (260) |
|  | 7 | Polymer-1 (100) | PAG-1 (0.55) | Siloxane compound #5 (15) | Amine-1 (0.1) | X-70-093 (0.1) | PGMEA (260) |
|  | 8 | Polymer-1 (100) | PAG-1 (0.55) | Siloxane compound #6 (15) | Amine-1 (0.1) | X-70-093 (0.1) | PGMEA (260) |
|  | 9 | Polymer-1 (100) | PAG-1 (0.55) | Siloxane compound #7 (15) | Amine-1 (0.1) | X-70-093 (0.1) | PGMEA (260) |
|  | 10 | Polymer-1 (100) | PAG-1 (0.55) | Siloxane compound #8 (15) | Amine-1 (0.1) | X-70-093 (0.1) | PGMEA (260) |
|  | 11 | Polymer-1 (100) | PAG-1 (0.50) | Siloxane compound #9 (15) | Amine-1 (0.1) | X-70-093 (0.1) | PGMEA (260) |
|  | 12 | Polymer-1 (100) | PAG-2 (0.50) | Siloxane compound #3 (15) | Amine-1 (0.1) | X-70-093 (0.1) | PGMEA (260) |
|  | 13 | Polymer-2 (100) | PAG-1 (0.50) | Siloxane compound #1 (15) | Amine-1 (0.1) | X-70-093 (0.1) | PGMEA (260) |
| Comparative Example | 1 | Polymer-1 (100) | PAG-1 (0.55) | Linker-1 (15) | Amine-1 (0.1) | X-70-093 (0.1) | PGMEA (260) |
|  | 2 | Polymer-1 (100) | PAG-1 (0.55) | Linker-2 (15) | Amine-1 (0.1) | X-70-093 (0.1) | PGMEA (260) |

TABLE 2

|  |  | Soft bake | PEB | Hard bake | Sensitivity (mJ/cm$^2$) | Pattern profile before hard bake | Pattern profile after hard bake | Rating |
|---|---|---|---|---|---|---|---|---|
| Example | 1 | 100° C. × 120 s | — | 200° C. × 1 hr | 220 | rectangular, perpendicular | rectangular, perpendicular, substantially unchanged | ◯ |
|  | 2 | 100° C. × 120 s | — | 200° C. × 1 hr | 260 | rectangular, perpendicular | rectangular, perpendicular, substantially unchanged | ◯ |
|  | 3-1 | 100° C. × 120 s | — | 200° C. × 1 hr | 220 | rectangular, perpendicular | rectangular, perpendicular, substantially unchanged | ⊚ |
|  | 3-2 | 100° C. × 120 s | 110° C. × 120 s | 200° C. × 1 hr | 180 | rectangular, perpendicular | rectangular, perpendicular, substantially unchanged | ◯ |
|  | 4 | 100° C. × 120 s | — | 200° C. × 1 hr | 300 | rectangular, perpendicular | rectangular, perpendicular, substantially unchanged | ◯ |
|  | 5 | 100° C. × 120 s | — | 200° C. × 1 hr | 200 | rectangular, perpendicular | rectangular, perpendicular, substantially unchanged | ◯ |
|  | 6 | 100° C. × 120 s | — | 200° C. × 1 hr | 200 | rectangular, perpendicular | rectangular, perpendicular, substantially unchanged | ◯ |
|  | 7 | 100° C. × 120 s | — | 200° C. × 1 hr | 220 | rectangular, perpendicular | rectangular, perpendicular, substantially unchanged | ◯ |
|  | 8 | 100° C. × 120 s | — | 200° C. × 1 hr | 240 | rectangular, perpendicular | rectangular, perpendicular, substantially unchanged | ◯ |
|  | 9 | 100° C. × 120 s | — | 200° C. × 1 hr | 240 | rectangular, perpendicular | rectangular, perpendicular, substantially unchanged | ◯ |
|  | 10 | 100° C. × 120 s | — | 200° C. × 1 hr | 200 | rectangular, perpendicular | rectangular, perpendicular, substantially unchanged | ◯ |
|  | 11 | 100° C. × 120 s | — | 200° C. × 1 hr | 240 | rectangular, perpendicular | rectangular, perpendicular, substantially unchanged | ◯ |

TABLE 2-continued

|  |  | Soft bake | PEB | Hard bake | Sensitivity (mJ/cm$^2$) | Pattern profile before hard bake | Pattern profile after hard bake | Rating |
|---|---|---|---|---|---|---|---|---|
|  | 12 | 100° C. × 120 s | — | 200° C. × 1 hr | 300 | rectangular, perpendicular | rectangular, perpendicular, substantially unchanged | ◎ |
|  | 13 | 100° C. × 120 s | — | 200° C. × 1 hr | 320 | rectangular, perpendicular | rectangular, perpendicular, substantially unchanged | ○ |
| Comparative Example | 1 | 100° C. × 120 s | — | 200° C. × 1 hr | 200 | rectangular, perpendicular | heat sags, rounded top | X |
|  | 2 | 100° C. × 120 s | — | 200° C. × 1 hr | 200 | pattern unresolved | — | X |

As seen from Table 2, the compositions of Examples 1 to 13 showed satisfactory sensitivity, resolution, development behavior, and pattern profile, and were proven to be photosensitive materials having satisfactory cure behavior. It has been demonstrated that the chemically amplified positive resist composition comprising the requisite components meets the required properties.

Japanese Patent Application No. 2012-214395 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified positive resist composition comprising (A) a base resin, (B) a photoacid generator, (C) a thermal crosslinker, and (D) an organic solvent, wherein
said base resin (A) is a polymer comprising recurring units having the general formula (1):

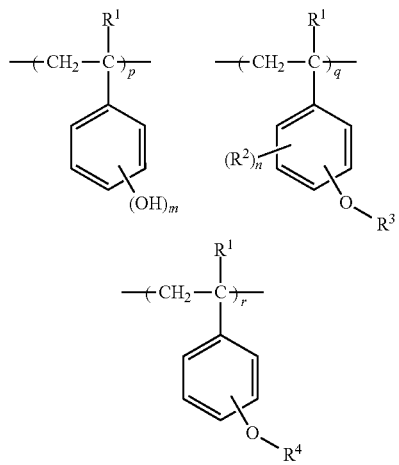

wherein $R^1$ is each independently hydrogen, hydroxyl, straight or branched alkyl, or trifluoromethyl, $R^2$ is hydroxyl or trifluoromethyl, $R^3$ is $C_4$-$C_{20}$ tertiary alkyl, $R^4$ is an acid labile group exclusive of tertiary alkyl, n is 0 or an integer of 1 to 4, m is 0 or an integer of 1 to 5, p, q and r each are 0 or a positive number, meeting $0.8 \leq p+q+r \leq 1$, the polymer having a weight average molecular weight of 1,000 to 500,000, and
said thermal crosslinker (C) is a siloxane compound comprising structural units having the general formula (2):

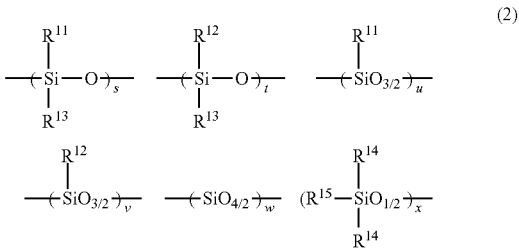

wherein $R^{11}$ is a crosslinking group having the general formula (3-1), (3-2) or (3-3):

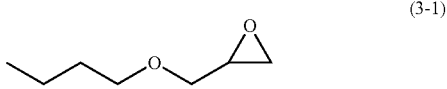

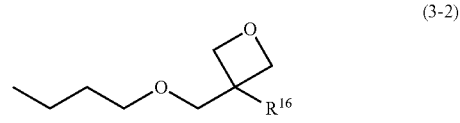

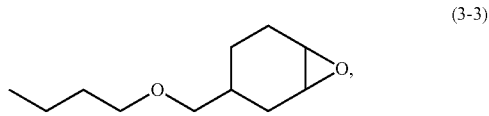

$R^{12}$ is a straight, branched or cyclic $C_1$-$C_{12}$ alkyl or aryl group, $R^{13}$ and $R^{14}$ each are as defined for $R^{12}$ or a $C_1$-$C_6$ alkoxy group, $R^{15}$ is as defined for $R^{11}$, $R^{12}$ or $R^{13}$, s, u and x each are 0 or a positive number, at least one of s, u and x is a positive number, with the proviso that $R^{15}$ is $R^{11}$ when both s and u are 0, t, v and w each are 0 or a positive number, $s+t+u+v+w+x=1$, and $R^{16}$ is hydrogen, $C_2$-$C_{20}$ alkyl, benzyl, phenyl or tolyl.

2. The resist composition of claim 1 wherein said thermal crosslinker (C) is a siloxane compound comprising structural units having the general formula (4):

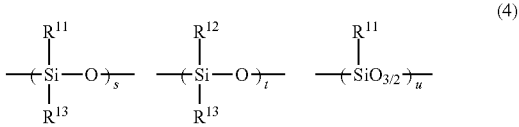

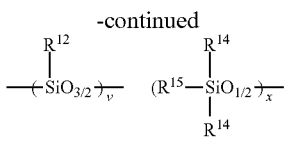

wherein $R^{11}$, $R^{12}$, $R^{13}$, $R^{14}$, $R^{15}$, s, t, u, v and x are as defined above, and s+t+u+v+x=1.

3. The resist composition of claim 1 wherein said thermal crosslinker (C) is a siloxane compound having a structure of the general formula (5) and containing at least two $R^{11}$ groups per molecule,

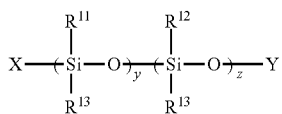

wherein X is trimethylsiloxy or a group of the following formula (6), Y is trimethylsilyl or a group of the following formula (7), X and Y may bond together to form a cyclic siloxane structure,

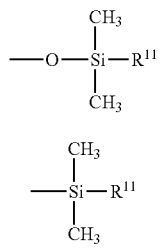

$R^{11}$, $R^{12}$, and $R^{13}$ are as defined above, y and z each are 0 or a positive number, and the sum of y and z is in a range of 2 to 10,000, with the proviso that X is a group of formula (6) and Y is a group of formula (7) when y is 0.

4. The resist composition of claim 3 wherein said thermal crosslinker (C) is a siloxane compound having a structure of the general formula (8), (9) or (10):

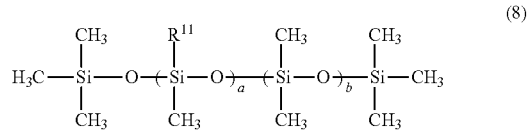

wherein $R^{11}$ is as defined above, a is a positive number of at least 2, b is 0 or a positive number, and the sum of a and b is 2 to 10,000,

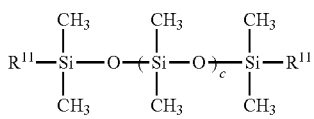

wherein $R^{11}$ is as defined above, c is 0 or a positive number from more than 0 to 10,000, wherein $R^{11}$ is as defined above, and d is a positive number of 3 to 10.

5. The resist composition of claim 1, further comprising (E) 0.01 to 2 parts by weight of a basic compound per 100 parts by weight of component (A).

6. A pattern forming process comprising applying the chemically amplified positive resist composition of claim 1 onto a substrate to form a resist layer, exposing a selected region of the resist layer, and developing.

7. The pattern forming process of claim 6, further comprising the step of heating the resist pattern layer resulting from the development step at 100 to 250° C. to form a cured resist pattern layer.

8. A cured resist pattern film obtained by the pattern forming process of claim 6.

* * * * *